United States Patent
Jennings et al.

(10) Patent No.: US 11,177,654 B1
(45) Date of Patent: Nov. 16, 2021

(54) ELECTRO-STATIC DISCHARGE (ESD) DAMAGE SELF-TEST

(71) Applicant: Xilinx, Inc., San Jose, CA (US)

(72) Inventors: John K. Jennings, Dublin (IE); James Karp, Saratoga, CA (US); Michael J. Hart, Paso Robles, CA (US)

(73) Assignee: XILINX, INC., San Jose, CA (US)

( * ) Notice: Subject to any disclaimer, the term of this patent is extended or adjusted under 35 U.S.C. 154(b) by 364 days.

(21) Appl. No.: 16/152,011

(22) Filed: Oct. 4, 2018

(51) Int. Cl.
*H02H 9/04* (2006.01)
*H02H 1/00* (2006.01)
*H01L 27/02* (2006.01)

(52) U.S. Cl.
CPC ......... *H02H 9/046* (2013.01); *H01L 27/0266* (2013.01); *H02H 1/0007* (2013.01); *H01L 27/0248* (2013.01)

(58) Field of Classification Search
CPC .. H02H 9/046; H02H 1/0007; H01L 27/0266; H01L 27/0248
See application file for complete search history.

(56) References Cited

U.S. PATENT DOCUMENTS

| | | | | |
|---|---|---|---|---|
| 2009/0289636 | A1* | 11/2009 | Hernandez | G01R 31/14 324/555 |
| 2010/0225347 | A1* | 9/2010 | Worley | G01R 31/002 324/762.06 |
| 2010/0271742 | A1* | 10/2010 | Shannon | G01R 31/002 361/56 |
| 2017/0276713 | A1* | 9/2017 | Guo | H05K 3/30 |
| 2018/0226788 | A1* | 8/2018 | Salcedo | H01L 27/0921 |
| 2019/0131787 | A1* | 5/2019 | He | H01L 29/7408 |
| 2019/0305549 | A1* | 10/2019 | Muljono | H02H 9/041 |

OTHER PUBLICATIONS

Karp, James et al., "Meet Automotive ESD and SEED Requirements with Zynq UltraScale+ MPSoCs," WP500 (v1.0), Feb. 13, 2018, pp. 1-12, Xilinx, Inc., San Jose, CA, USA.
Diep, Tom, et al. "Electrostatic Discharge (ESD)," Application Report SSYA010A, Jun. 2014, pp. 1-7, Texas Instruments, Dallas, Texas, USA.

* cited by examiner

*Primary Examiner* — Kyle J Moody
*Assistant Examiner* — Lakaisha Jackson
(74) *Attorney, Agent, or Firm* — Patterson + Sheridan, LLP

(57) ABSTRACT

Examples described herein provide a circuit and methods for self-testing to detect damage to a device, which damage may be caused by an Electro-Static Discharge (ESD) event. In an example, an integrated circuit includes an input/output circuit, an ESD protection circuit, and a system monitor. The input/output circuit has an input/output node. The ESD protection circuit is connected to the input/output node. The system monitor has a driving/measurement node selectively connectable to the input/output node. The system monitor is configured to drive and measure a voltage of the driving/measurement node. The system monitor is further configured to determine, based on driving and measuring the voltage of the driving/measurement node, whether a damaged device is present. The damaged device is in the input/output circuit or the ESD protection circuit.

20 Claims, 5 Drawing Sheets

ELECTRO-STATIC DISCHARGE (ESD) DAMAGE SELF-TEST

TECHNICAL FIELD

Examples of the present disclosure generally relate to integrated circuits and methods and, in particular, to integrated circuits and methods for self-testing to detect damage that may result from an Electro-Static Discharge (ESD) event.

BACKGROUND

Electro-Static Discharge (ESD) problems are increasing in the electronics industry because of the trends toward higher speed and smaller device sizes. Static charge is an unbalanced electrical charge at rest. Typically, it is created by insulator surfaces rubbing together or pulling apart. One surface gains electrons, while the other surface loses electrons. This results in the unbalanced electrical charge. When a static charge moves from one surface to another, it becomes ESD. ESD creates a current between two surfaces that have different potentials. The current can damage or destroy gate dielectrics, metallization, and junctions. ESD can be a major consideration in the design and manufacture of integrated circuits.

SUMMARY

In an example, an integrated circuit includes an input/output circuit, an Electro-Static Discharge (ESD) protection circuit, and a system monitor. The input/output circuit has an input/output node. The ESD protection circuit is connected to the input/output node. The system monitor has a driving/measurement node selectively connectable to the input/output node. The system monitor is configured to drive and measure a voltage of the driving/measurement node. The system monitor is further configured to determine, based on driving and measuring the voltage of the driving/measurement node, whether a damaged device is present. The damaged device is in the input/output circuit or the ESD protection circuit.

Another example is a method of operating an integrated circuit. Using a system monitor, a driving/measurement node of the system monitor is selectively connected to an input/output node of an input/output circuit. An ESD protection circuit is connected to the input/output node. Using the system monitor, a voltage of the driving/measurement node is driven. At least some of the driving is performed while the driving/measurement node is connected to the input/output node. Using the system monitor, a voltage difference between measured voltages of the driving/measurement node is determined. The voltage difference is at least partially in response to driving the voltage of the driving/measurement node. Using the system monitor, whether the voltage difference indicates a presence of a damaged device is determined. The damaged device is in the input/output circuit or the ESD protection circuit. Using the system monitor, a result corresponding to whether the voltage difference indicates the presence of the damaged device is stored in memory.

In another example, an integrated circuit includes an input/output circuit, an ESD protection circuit, and a system monitor. The input/output circuit has an input/output node. The ESD protection circuit is connected to the input/output node. The system monitor has a driving/measurement node selectively connectable to the input/output node. The system monitor includes a driver, an analog-to-digital converter (ADC), and a controller. The driver is configured to drive a voltage of the driving/measurement node. The ADC is configured to obtain measurement data relating to the driving/measurement node. The controller is communicatively coupled to the driver and the ADC. The controller is operable to determine whether the measurement data, in response to driving the voltage of the driving/measurement node, indicates a presence of a damaged device. The damaged device is in the input/output circuit or the ESD protection circuit.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
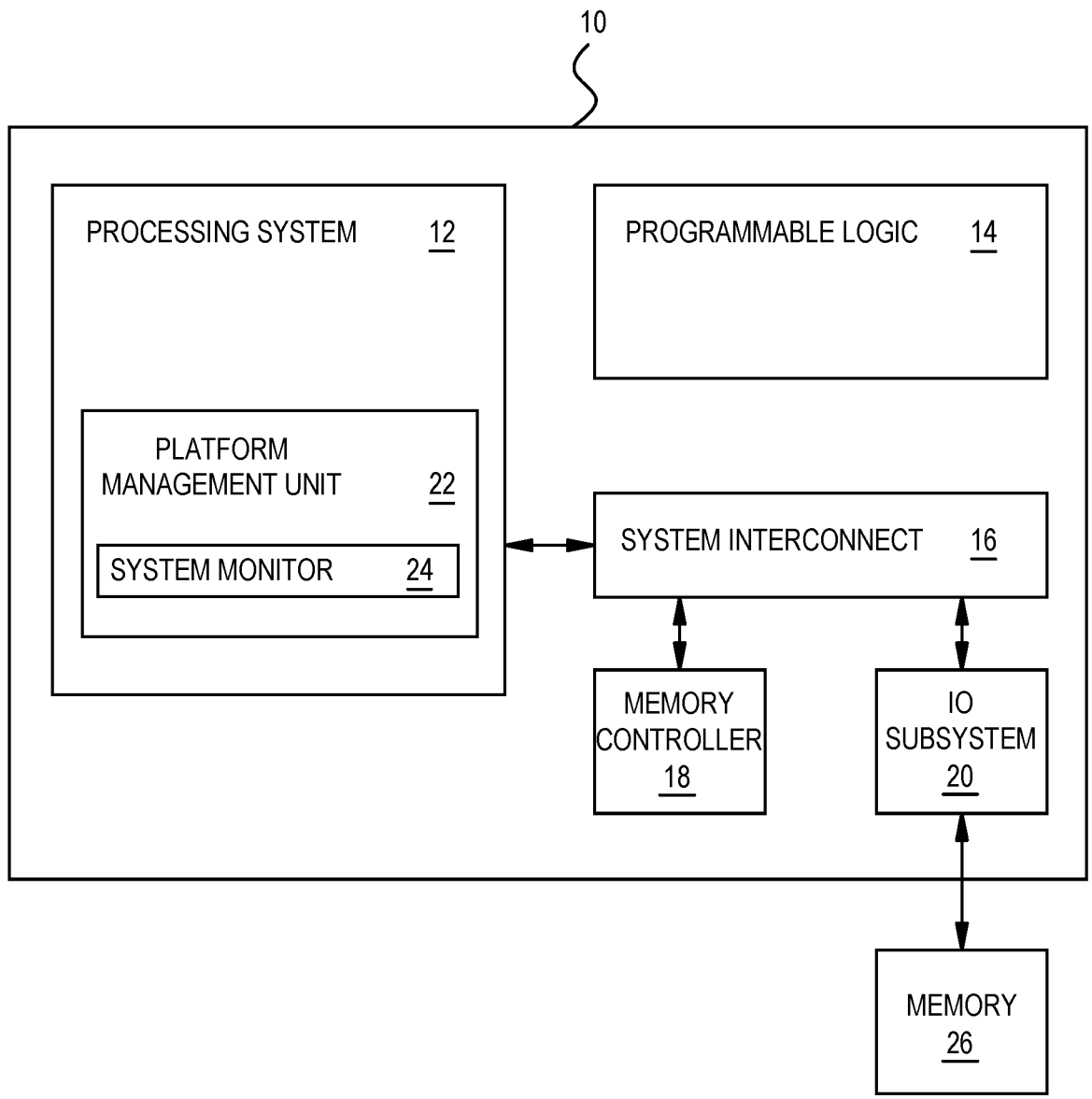
FIG. 1 is a block diagram depicting a System-on-Chip (SoC) according to some examples.

Examples described herein relate generally to detection of damage in an integrated circuit (IC), which may be caused by an Electro-Static Discharge (ESD) event. Damage resulting from an ESD event can occur at any of multiple instances during the manufacture of systems that include an IC. Testing at some times during the manufacture can detect and identify such damage, which can cause an IC having such damage to be discarded and/or reworked. For example, ESD damage can be detected at Wafer Acceptance Testing (WAT) when the IC is part of a larger substrate (e.g., wafer) and/or at testing of a package in which the IC is incorporated. However, any ESD damage that occurs after the testing of the package is generally not detected unless such damage renders a device on the IC non-functional. For example, an ESD event can occur during handling the package up to and including attachment of the package to a Printed Circuit Board (PCB) and subsequent handling of the PCB.

At smaller IC technology nodes, thin gate transistors may be more susceptible to ESD damage. Devices can be damaged by a small ESD event, yet still remain functional. However, such damage can shorten the lifespan of the devices, and the devices can fail shortly after the system, or component of the system, is provided, e.g., to a customer.

Examples described herein provide a circuit and methods for self-testing to detect damage to a device, which damage may be caused by an ESD event. Damage of a device may be small, and the device may still be functional. Leakage current through the device may be detected by measuring various voltages, and differences in measure voltages can indicate the leakage current. Greater differences in measured voltages can indicate greater leakage current, which can be indicative of damage to a device.

A circuit is provided with a system monitor that is capable of driving a voltage of a driving/measurement node, which is selectively connectable to an input/output node of the circuit. When the driving/measurement node is connected to the input/output node and the voltage of the driving/measurement node is driven, charge can accumulate on the input/output node, which charges the input/output node. In some examples, the system monitor measures the voltage of the driving/measurement node and/or input/output node during the driving or at some time thereafter, and subsequently measures the voltage of the driving/measurement node and/or input/output node. The system monitor determines whether a difference in the measured voltages indicates an amount of leakage in the circuit. In other examples, the system monitor measures the voltage of a driving/measurement node of the system monitor while providing a voltage to charge the input/output node but before the driving/measurement node is connected to the input/output node. Subsequently, the system monitor measures the voltage of the driving/measurement node while providing the voltage to charge the input/output node and while the driving/measurement node is connected to the input/output node. The system monitor determines whether a difference in the measured voltages indicates an amount of leakage in the circuit.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. For example, various methods according to some examples can include more or fewer operations, and the sequence of operations in various methods according to examples may be different than described herein. In addition, an illustrated example need not have all the aspects or advantages shown. An aspect or an advantage described in conjunction with a particular example is not necessarily limited to that example and can be practiced in any other examples even if not so illustrated or if not so explicitly described.

FIG. 1 is a block diagram depicting a System-on-Chip (SoC) 10 according to some examples. The SoC 10 in the illustrated example is a programmable integrated circuit, such as a Field Programmable Gate Array (FPGA), Complex Programmable Logic Device (CPLD), or the like. In other examples, the SoC 10 can be any SoC implemented as an Application Specific Integrated Circuit (ASIC), Application Specific Standard Product (ASSP), or the like. Although the illustrated example is a SoC, other examples may not be a SoC.

The SoC 10 in the illustrated example includes a processing system 12, programmable logic 14, a system interconnect 16, a memory controller 18, and an input/output (IO) subsystem 20. The processing system 12 includes a platform management unit 22 with a system monitor 24. The processing system 12 can include microprocessor(s), controllers, memory, support circuits, IO circuits, and the like. The platform management unit 22 can include a processor, a controller, and/or other circuitry for implementing configurations in the SoC 10 and to monitor various operations of the SoC 10. The platform management unit 22 can include memory or registers that store instructions that are executed by the platform management unit 22 at runtime to read configuration data from memory or registers that is then used to configure the SoC 10. The system monitor 24 includes circuitry to monitor temperature of the SoC 10, voltages of various nodes in the SoC 10, and other functions. Additional details of the system monitor 24 are described subsequently.

The programmable logic 14 can include logic cells, support circuits, and programmable interconnects. The logic cells can include circuits that can be configured to implement general logic functions of a plurality of inputs. The support circuits include dedicated circuits, such as transceivers, input/output blocks, digital signal processors, memories, and the like. The logic cells and the support circuits can be interconnected using the programmable interconnect.

The system interconnect 16 is communicatively coupled to each of the processing system 12, programmable logic 14, memory controller 18, and IO subsystem 20. The system interconnect 16 can include one or more different interconnects, such as a programmable Network-on-Chip (NoC) for communications between subsystems, a NoC Peripheral Interconnect (NPI) for configuring the NoC and/or other components, and a configuration interconnect for configuring the programmable logic 14.

The memory controller 18 can be any standard-based or proprietary memory controller. In some examples, the memory controller 18 includes a Double Data Rate fourth-generation Synchronous Dynamic Random Access Memory (DDR4 SDRAM) controller, a High Bandwidth Memory (HBM) controller, and/or the like. The IO subsystem 20 can include any IO circuits, which may be standard interface circuits, proprietary circuits, user-defined circuits, or the like.

The SoC 10 is communicatively coupled to memory 26. The memory 26 can be or include any memory, such as Static Random Access Memory (SRAM), Dynamic Random Access Memory (DRAM), Read Only Memory (ROM), or the like. The memory 26 can be accessed (e.g., read from or written to) via the IO subsystem 20. The memory 26 is off-chip from the SoC 10. In other examples, memory can be disposed on the SoC.

Figure 2:
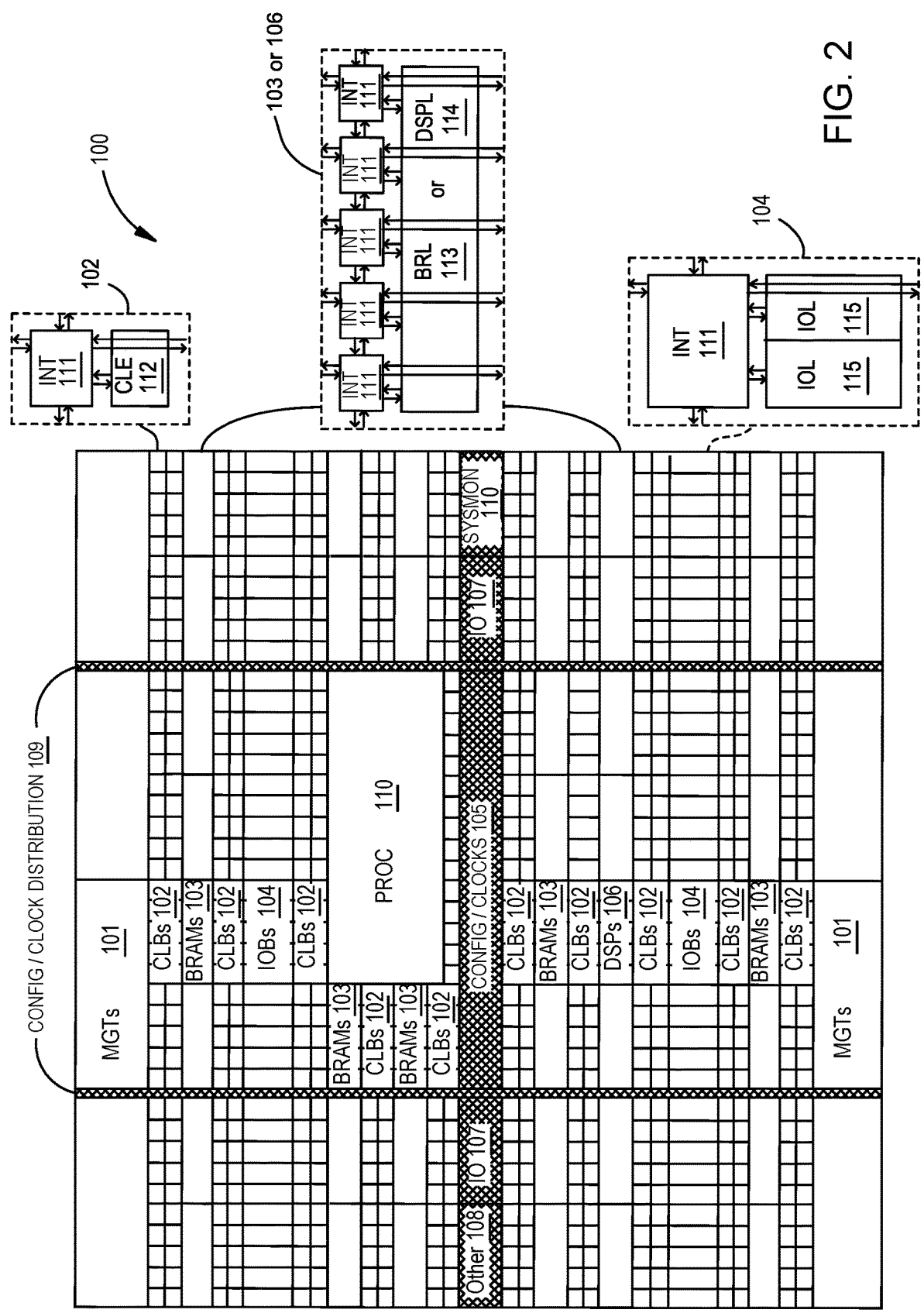
FIG. 2 illustrates a Field Programmable Gate Array (FPGA) architecture according to some examples.

FIG. 2 illustrates an FPGA architecture 100 of a programmable IC according to some examples. The programmable IC is an example SoC as described above with respect to FIG. 1. The FPGA architecture 100 includes a large number of different programmable tiles including multi-gigabit transceivers (MGTs) 101, configurable logic blocks (CLBs) 102, random access memory blocks (BRAMs) 103, input/output blocks (IOBs) 104, configuration and clocking logic (CONFIG/CLOCKS) 105, digital signal processing blocks (DSPs) 106, specialized input/output blocks (IO) 107 (e.g., configuration ports and clock ports), and other programmable logic 108 (such as digital clock managers, analog-to-digital converters, system monitoring logic, and so forth). The FPGA architecture 100 also includes dedicated processor blocks (PROC) 110.

In some FPGAs, each programmable tile includes a programmable interconnect element (INT) 111 having standardized connections to and from a corresponding interconnect element in each adjacent tile. Therefore, the programmable interconnect elements taken together implement the programmable interconnect structure for the illustrated FPGA architecture 100. The programmable interconnect element 111 also includes the connections to and from the programmable logic element within the same tile, as shown by the examples included at the top of FIG. 2.

For example, a CLB 102 can include a configurable logic element (CLE) 112 that can be programmed to implement user logic plus a single programmable interconnect element (INT) 111. A BRAM 103 can include a BRAM logic element (BRL) 113 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 106 can include a DSP logic element (DSPL) 114 in addition to an appropriate number of programmable interconnect elements. An 10B 104 can include, for example, two instances of an input/output logic element (IOL) 115 in addition to one instance of the programmable interconnect element 111. As will be clear to those of skill in the art, the actual IO pads connected, for example, to the IO logic element 115 typically are not confined to the area of the input/output logic element 115.

In the pictured example, a horizontal area near the center of the die (shown in FIG. 2) is used for configuration, clock, and other control logic. Vertical columns 109 extending from this horizontal area or column are used to distribute the clocks and configuration signals across the breadth of the FPGA.

The FPGA architecture 100 includes a system monitor circuit (SYSMON) 150. The SYSMON 150 can include a driver (which may be a Digital-to-Analog Converter (DAC)) and an Analog-to-Digital Converter (ADC). The driver can be implemented to charge a node of a MGT 101, such as described below. The ADC can be implemented to measure a voltage of a node, such as the charged node of the MGT or a node at an output of the SYSMON 150, as described below. In some examples, the SYSMON 150 can include other analog circuit(s) for performing analog signal processing. Various components of a platform management unit (including the SYSMON 150) can be distributed throughout the horizontal area and/or vertical columns of the FPGA architecture 100.

Some FPGAs utilizing the architecture illustrated in FIG. 2 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 2 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 2 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 3:
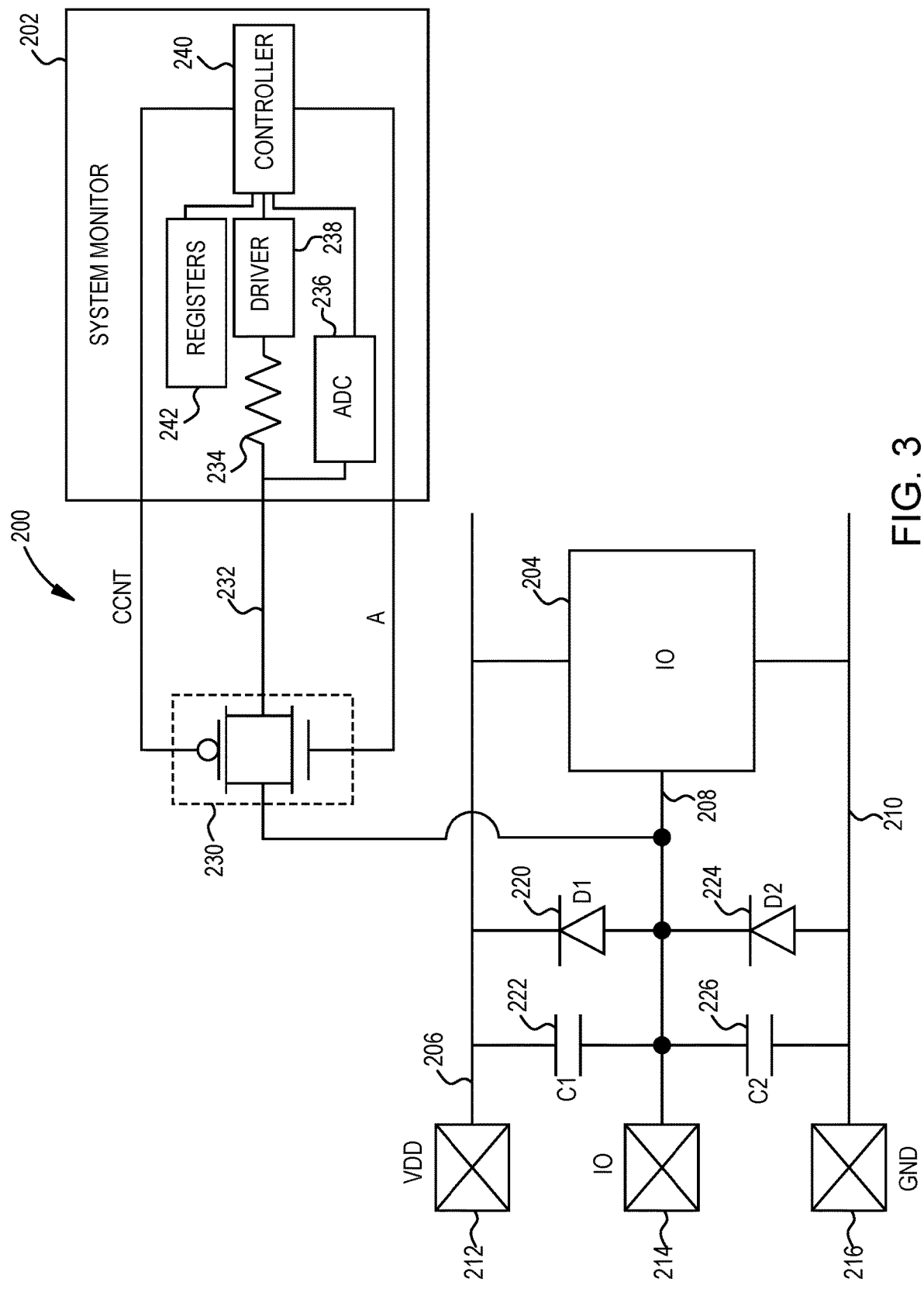
FIG. 3 illustrates an integrated circuit (IC) including damage self-test capabilities, according to some examples.

FIG. 3 illustrates an IC 200 including damage self-test capabilities, according to some examples. The IC 200 can be implemented in a package, and hence, the IC 200 can be attached to a package substrate. Various components described below can be implemented in the IC 200, in the package substrate, or a combination thereof.

The IC 200 includes a system monitor 202 and an IO circuit 204. The IC 200 can be implemented in the SoC 10 in FIG. 1, or further, the FPGA architecture 100 in FIG. 2. For example, in the context of the FPGA architecture 100, the system monitor 202 can be the SYSMON 150, and the IO circuit 204 can be one of the MGTs 101, other IO 107, or the like. The IC 200 can be implemented on any IC, which may be an ASIC or other IC, which may be programmable or non-programmable.

A first power node 206, an IO node 208, and a second power node 210 are in the IC 200 and/or the package substrate (if implemented where the IC 200 is attached to the package substrate). The first power node 206 can be for supplying a first power voltage (e.g., a power voltage VDD), and the second power node 210 can be for supplying a second power voltage (e.g., ground GND). The IO circuit 204 is connected between the first power node 206 and the second power node 210, e.g., to provide power to the IO circuit 204. The IO node 208 is connected to the IO circuit 204, e.g., such that the IO circuit 204 is operable to transmit a signal on the IO node 208 and to receive a signal via the IO node 208. The IO circuit 204 can be any IO circuit that is capable of being set in a high-impedance mode or tri-stated.

The first power node 206, IO node 208, and second power node 210 are connected to a first external connector 212, a second external connector 214, and a third external connector 216, respectively. The first external connector 212, second external connector 214, and third external connector 216 are external to the chip of the IC 200 and/or to the package substrate. The first external connector 212, second external connector 214, and third external connector 216 may be or include pads and/or Controlled Collapse Chip Connection (C4) bumps or Ball Grid Array (BGA) balls, for example, on an exterior of the chip of the IC 200 or package substrate.

The IC 200 includes an ESD protection circuit. The ESD protection circuit includes a first diode (D1) 220 and a second diode (D2) 224. The first diode 220 and second diode 224 may each be or include a p-n junction in the semiconductor substrate of the IC 200, a field effect transistor (FET) having the gate connected to the drain, or the like. The ESD protection circuit is illustrated to further include a first capacitor (C1) 222 and a second capacitor (C2) 226. The first capacitor 222 and second capacitor 226 can each be a capacitor formed in, e.g., metal layers in the IC 200, can each be an effective capacitance (e.g., a parasitic capacitance) formed between interconnects in the metal layers in the IC 200 and/or the package substrate, or a combination thereof. The first diode 220 and first capacitor 222 are connected in parallel between the first power node 206 and the IO node 208. The cathode of the first diode 220 is connected to the first power node 206, and the anode of the first diode 220 is connected to the IO node 208. The second diode 224 and second capacitor 226 are connected in parallel between the IO node 208 and the second power node 210. The cathode of the second diode 224 is connected to the IO node 208, and the anode of the second diode 224 is connected to the second power node 210.

A switch 230 is connected to the IO node 208. In the illustrated example, the switch 230 is a pass gate (e.g., parallel connected n-type FET and p-type FET). In other examples, the switch 230 can be a single FET or other switching device. The switch 230 is further connected to a driving/measurement node 232 of the system monitor 202.

The system monitor 202 includes an output impedance 234, an ADC 236, a driver 238, a controller 240, and registers 242. The driving/measurement node 232 is connected to a first terminal of the output impedance 234 (e.g., a resistance at DC) and to an input node of the ADC 236. A second terminal (opposite from the first terminal) of the output impedance 234 is further connected to an output node of the driver 238. The driver 238 can have a set output voltage or a variable output voltage. In some examples, the driver 238 can be or include a DAC. The ADC 236 and driver 238 are connected to the controller 240. The controller 240 is operable to receive digital data indicating a voltage sensed by the ADC 236 and to transmit a signal to control the driver 238. For example, the controller 240 can transmit an enable signal to the driver 238 when the driver 238 has a set output voltage, or can transmit digital data to the driver 238 to set the variable output voltage when the driver 238 has a variable output voltage. The controller 240 can be a reduced instruction set computer (RISC) processor or other logic circuitry. The registers 242 can store configuration data of the controller 240. The registers 242 can be written by a user, e.g., using Advanced eXtensible Interface (AXI) memory mapped transactions. In some examples, the registers 242 can also be read from or written to via Joint Test Action Group (JTAG), Inter-Integrated Circuit (I2C), and/or Power Management Bus (PMBus) interfaces. The registers 242 can be access via, e.g., the platform management system and the processing system when implemented in the context of FIG. 1.

The switch 230 is controlled by a control signal CNT and a complementary control signal CCNT output from the controller 240 of the system monitor 202. Depending on the control signal CNT and complementary control signal CCNT, the switch 230 can be selectively opened or closed. In a closed condition, the driving/measurement node 232 of the system monitor 202 is connected to the IO node 208 via the switch 230. When the switch 230 is in an opened condition, the driving/measurement node 232 of the system monitor 202 is de-coupled from the IO node 208.

The driving/measurement node 232 can be connected to other switches, which are each connected to an IO node of a respective IO circuit. The controller 240 can generate different control signals to control the switches such that the IO circuits are tested at different times. In some examples, each switch that is connected to an IO node of an IO circuit can be connected to a separate configuration of the output impedance 234, ADC 236, and driver 238. Various combinations and permutations may be implemented.

The IC 200 can be fabricated as part of a larger substrate (e.g., a wafer). Before the IC 200 is singulated from the larger substrate, the IC 200 (and other similarly formed ICs formed as part of the larger substrate) can undergo testing, such as a wafer acceptance test (WAT). The WAT can determine and confirm the functionality of the IC 200, which may include determining whether any device of the IC 200 has experienced any damage, such as due to an ESD event. The IC 200 can then be singulated from the larger substrate and attached to a package substrate, such as by reflowing external connectors (e.g., C4 bumps) that connect the IC 200 to the package substrate, which forms a package. The structures in which the IC 200 may be incorporated and attached to the package substrate can vary. For example, the IC 200 may be attached directly to the package substrate with or without another one or more IC attached directly to the package substrate. The IC 200 may be attached to an interposer, which may have another one or more ICs attached thereto, and the interposer is attached directly to the package substrate. Further, the IC 200 may be part of a multiple die stack that is attached to the package substrate. Any configuration or structure may be implemented, such as any combination of the foregoing examples. The IC 200 can be also be encapsulated on the package substrate, such as by a molding compound, in some examples.

The IC 200 and package substrate can then undergo further testing to determine and confirm the functionality of the package. This testing may also determine whether any device of the IC 200 has experienced any damage, such as due to an ESD event. After testing, the package is handled further. The package is attached to a printed circuit board (PCB), for example, and may be further handled and incorporated in a larger system.

The IC 200 is capable of performing a self-test to detect whether devices may have experienced damage, such as due to an ESD event, subsequent to the testing of the package. The damage may not be sufficiently detrimental to prevent the IC 200 from proper functioning at the time the package is incorporated into a larger system, for example. However, the damage may significantly shorten the useful lifespan of the IC 200. Accordingly, the self-test can detect such damaged devices, which may enable an added level of quality control for products provided to, e.g., customers.

Figure 4:
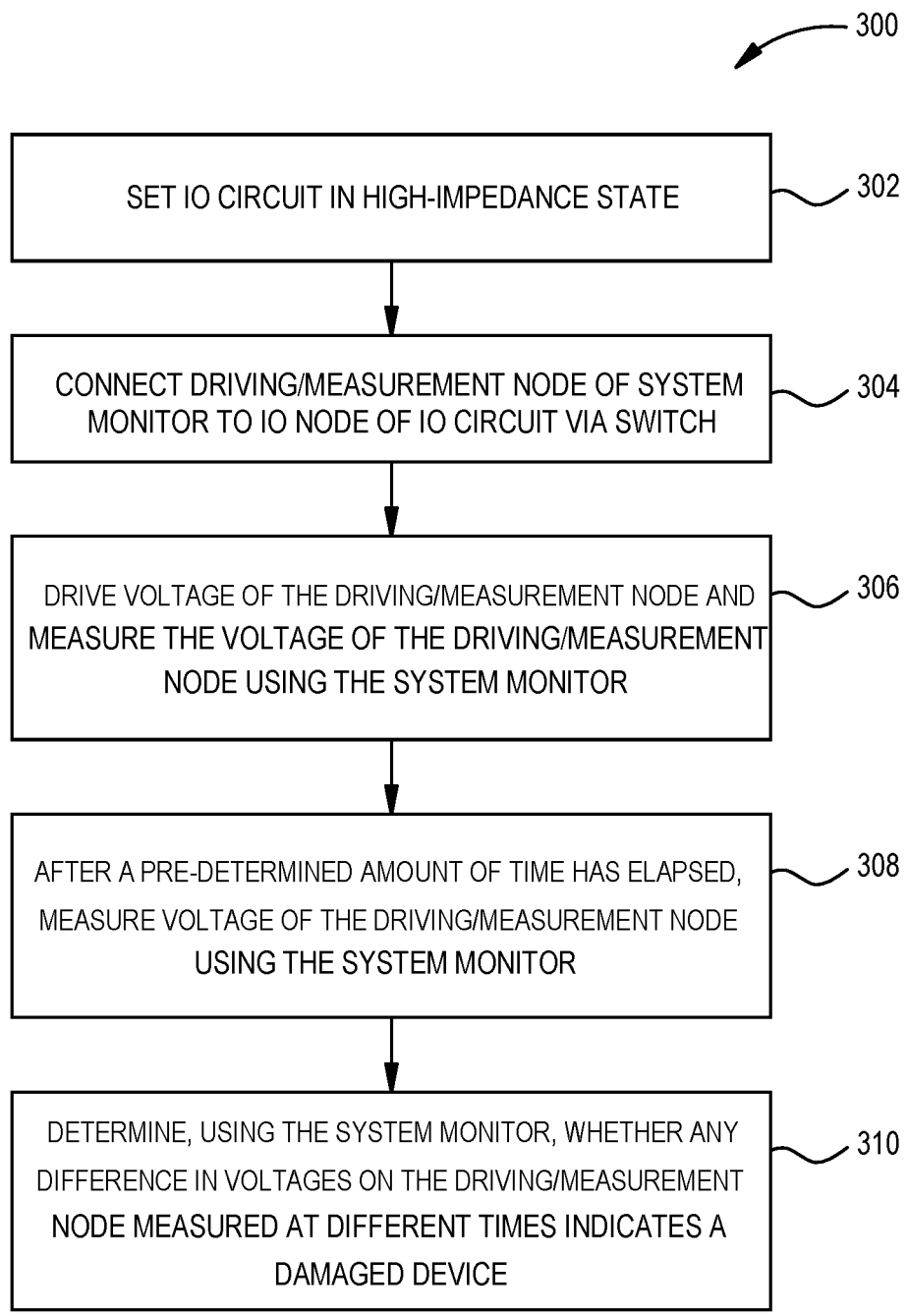
FIG. 4 is a flow chart of a method for performing a self-test, according to some examples.

FIG. 4 is a flow chart of a method 300 for performing a self-test, according to some examples. In operation 302, the IO circuit 204 is set to be in a high-impedance state throughout the self-test. The high-impedance state can substantially prevent charge on the IO node 208 from draining through the IO circuit 204 as a result of normal functionality of the IO circuit 204. However, as described below, charge on the IO node 208 may drain through the IO circuit 204 if a device of the IO circuit 204 has been damaged. The self-test can be initiated by a user writing a test initiate value to one of the registers 242, which initiates the controller 240 to start the self-test. The controller 240 may communicate with the IO circuit 204, or another circuit that controls the IO circuit 204, to cause the IO circuit 204 to be set in the high-impedance state. The writing of the test initiate value to the register can be performed, e.g., by a user-controlled computer or other test environment communicatively coupled to the IC 200, which causes a memory mapped transaction to be transmitted to the register.

In operation 304, the driving/measurement node 232 of the system monitor 202 is connected to the IO node 208 via the switch 230. The controller 240 of the system monitor 202 can send the control signal CNT and complementary control signal CCNT to cause the switch 230 to close to thereby connect the driving/measurement node 232 to the IO node 208. The controller 240 can determine when the IO circuit 204 has been set in the high-impedance state and subsequently transmit the control signal CNT and complementary control signal CCNT to cause the switch 230 to close.

In operation 306, the system monitor 202 drives the voltage of the driving/measurement node 232 (to thereby charge the IO node 208) while the driving/measurement node 232 is connected to the IO node 208 via the switch 230. The voltage to which the driving/measurement node 232 and the IO node 208 are driven is a voltage that is less than the voltage of the first power node 206 and greater than the voltage of the second power node 210. In some examples, when the power voltage VDD is applied to the first power node 206 and ground is applied to the second power node 210, the voltage to which the system monitor 202 drives the driving/measurement node 232 and IO node 208 is VDD/2, although other voltages can be implemented. Generally, driving the voltage of the IO node 208 causes a voltage drop between the first power node 206 and the IO node 208 and another voltage drop between the IO node 208 and the second power node 210. These voltage drops, in the absence of leakage or other current, would be maintained on the IO node 208 by the first capacitor 222 and the second capacitor 226 (e.g., by the parasitic capacitances). If any device has been damaged, such as due to an ESD event, leakage through that device can occur, which can cause additional charge to accumulate on or can cause charge to drain from the first capacitor 222 and the second capacitor 226.

In some examples where the driver 238 has a set output voltage, the controller 240 transmits an enable signal to the driver 238 to cause the driver 238 to output the set voltage from the driver 238. This voltage output from the driver 238 drives the driving/measurement node 232 and charges the IO node 208. In some examples where the driver 238 has a variable output voltage, a value corresponding to the voltage to which the driving/measurement node 232 is to be driven and the IO node 208 is to be charged can be written to a register of the registers 242. The controller 240 can read the value of the register and transmit digital data to the driver 238. Based on the digital data, the driver 238 can output a voltage to drive the driving/measurement node 232 and to charge the IO node 208 to the voltage. The output impedance 234 in some examples can be omitted or a low impedance.

Further, in operation 306, the voltage of the driving/measurement node 232 (and the IO node 208) is measured using the system monitor 202 while driving the voltage of the driving/measurement node 232 (and charging the IO node 208) and when the driving/measurement node 232 is connected to the IO node 208 via the switch 230. The measuring may be performed when the voltage of the IO node 208 has reached a steady state. The ADC 236 can measure the voltage on the driving/measurement node 232 and transmit digital data corresponding to the measured voltage to the controller 240. The driving of the voltage of the driving/measurement node 232 and charging of the IO node 208 by the system monitor 202 can then be terminated. For example, the controller 240 can transmit a disable signal to the driver 238 or send digital data to the driver 238 to cause the driver 238 to be in a high-impedance state.

In operation 308, after a pre-determined amount of time has elapsed from the termination of the driving of the voltage of the driving/measurement node 232 (and thereby charging of the IO node 208), the system monitor 202 measures the voltage of the driving/measurement node 232 (and IO node 208) when the driving/measurement node 232 is connected to the IO node 208 via the switch 230. The pre-determined amount of time may be any duration, and some examples contemplate the pre-determined amount of time being 0.1 milliseconds. As will become apparent, the pre-determined amount of time has a duration that permits distinguishing a nominal leakage that may be within an acceptable specification from a leakage that may be caused by damage from an ESD event. The pre-determined amount of time may be indicated by a value written to a register of the registers 242, which is read by the controller 240. The controller 240 can determine when the amount of time has elapsed, for example, by counting clock cycles of a clock signal of the IC 200 until the number of counted clock cycles from the termination of the driving and charging equals the pre-determined amount of time. The ADC 236 can measure the voltage on the driving/measurement node 232 and transmits digital data corresponding to the measured voltage to the controller 240. Operation 308 may be performed repeatedly to obtain a number of measurements that can increase confidence in a subsequent determination.

In operation 310, the system monitor 202 determines whether any difference in voltages on the driving/measurement node 232 measured at different times indicates a damaged device. The controller 240 can determine the difference in measured voltages by subtracting the digital data corresponding to the measured voltages transmitted from the ADC 236. A specification can be stored as a value in a register of the registers 242, and the controller 240 can read this value from the register and compare the value with the difference in measured voltages to determine whether any device is damaged.

Leakage through a device can occur as a result of the voltage drop between the IO node 208 and the first power node 206 or between the IO node 208 and the second power node 210. If a device is connected between the IO node 208 and the first power node 206 (e.g., the first diode 220 and/or a device in the IO circuit 204), leakage current through that device will tend to cause the voltage of the IO node 208 to approach the voltage of the first power node 206 (e.g., the power voltage VDD). If a device is connected between the IO node 208 and the second power node 210 (e.g., the second diode 224 and/or a device in the IO circuit 204), leakage current through that device will tend to cause the voltage of the IO node 208 to approach the voltage of the second power node 210 (e.g., ground GND).

At DC, the leakage current through a device is a function of the resistance of the device and the voltage drop across that device (e.g., I=V/R). When the device is damaged by an ESD event, the leakage current generally increases, which is indicative of a reduction of resistance of the device.

Upon removal of a voltage source, the voltage difference over a pre-determined amount of time is a function of the effective resistance-capacitance (RC) constant, or time constant tau ($\tau$=RC), of the circuit. The voltage difference may be in the general form of:

$$\Delta V = V_0 - V_1 = V_0(e^{t1/RC} - e^{t0/RC})$$

where $\Delta V$ is the voltage difference, $V_0$ is the voltage of the IO node 208 at time $t_0$, and $V_1$ is the voltage of the IO node 208 at subsequent time $t_1$. As stated above, when a device is damaged due to an ESD event, the resistance of that device is reduced, which in turn, reduces the effective RC constant of the circuit. With a reduced RC constant, the voltage on the IO node 208 changes more significantly (by increase or decrease) over a pre-determined amount of time relative to the circuit without the RC constant being reduced.

Accordingly, the voltage of the IO node 208 can be obtained at different times, such as by measurement, and the difference in the voltage at the different times can indicate the RC constant of the circuit. If the difference in voltage is large, the RC constant can be small due, whereas if the difference in voltage is large, the RC constant can be large. A large difference in voltage is indicative of a low resistance, which may be caused by damage from an ESD event.

In some examples, the controller 240 of the system monitor 202 can determine if the magnitude of the voltage difference is within or exceeds a specification that is based on the pre-determined time between obtaining the voltages. If the magnitude is within the specification, no significant damage to a device in the IO circuit 204 or its corresponding ESD protection circuit is determined to have occurred, but if the magnitude is not within the specification, damage to a device in the IO circuit 204 or its corresponding ESD protection circuit is determined to have occurred. For example, in the absence of damage, the IO circuit 204 and corresponding ESD protection circuit has a parasitic capacitance on the order of 1 pF and resistance of a leakage path of 0.1 G$\Omega$, which results in a time constant of 0.1 ms. In such an example, if the voltage difference between the initially charged voltage and the voltage measured 0.1 ms after terminating the charging, the specification can be that the measured voltage is within 50% of the initially charged voltage to indicate that no significant ESD damage has occurred. If the voltage difference is greater than 50% of the initially charged voltage, for example, then a determination is made that ESD damage to a device has occurred. The pre-determined time in similar examples can be in a range from 10 μs to 0.1 ms.

In other examples, by obtaining the voltage difference between a known, time difference, the controller 240 of the system monitor 202 can calculate the RC constant. With the RC constant determined, the controller 240 of the system monitor 202 can compare the determined RC constant with a specification. If the RC constant is within the specification, the controller 240 determines that the IO circuit 204 and corresponding ESD protection circuit does not have significant damage due to ESD. If the RC constant is not within the specification, the controller 240 determines that the IO circuit or corresponding ESD protection circuit has damage.

The controller 240 can write the determination to one or more registers of the registers 242 or other memory for subsequent access by a user and/or output to a user interface device. The method 300 can be performed on each IO circuit in the IC 200 and can be performed repeatedly for each IO circuit. The determinations resulting from the various performances of the method 300 can be written to the registers 242 or other memory and/or output to a user interface device. With the determination(s), a user can decide whether to provide the IC 200 to, e.g., a customer, to rework the package with the IC 200 (if possible), or to scrap the package.

In some examples, the sign of the voltage difference (e.g., positive or negative) can identify whether a damaged device is connected between the first power node 206 and the IO node 208 or between the IO node 208 and the second power node 210. If the subsequently measured voltage is greater than the earlier measured voltage causing the voltage difference to be negative, the damaged device is connected between the first power node 206 and the IO node 208 since damage to such a device tends to pull the voltage of the IO node 208 toward the greater voltage of the first power node 206. If the subsequently measured voltage is less than the earlier measured voltage causing the voltage difference to be positive, the damaged device is connected between the IO node 208 and the second power node 210 since damage to such a device tends to pull the voltage of the IO node 208 toward the lesser voltage of the second power node 210.

In other examples, the voltage to which the IO node 208 can be charged in the method 300 of FIG. 4 can be the voltage of the first power node 206 (e.g., the power voltage VDD) and/or the voltage of the second power node 210 (e.g., ground GND). The method 300 can be performed twice, each at one of the different voltages, to determine whether a damaged device is present. Charging to the voltage of the first power node 206 (e.g., the power voltage VDD) detects damage to any device connected between the IO node 208 and the second power node 210. Since, in that instance, there is no voltage drop between the first power node 206 and the IO node 208, there would be no leakage current between devices connected between the first power node 206 and the IO node 208. Similarly, charging to the voltage of the second power node 210 (e.g., ground GND) detects damage to any device connected between the first power node 206 and the IO node 208. Since, in that instance, there is no voltage drop between the IO node 208 and the second power node 210, there would be no leakage current between devices connected between the IO node 208 and the second power node 210.

Figure 5:
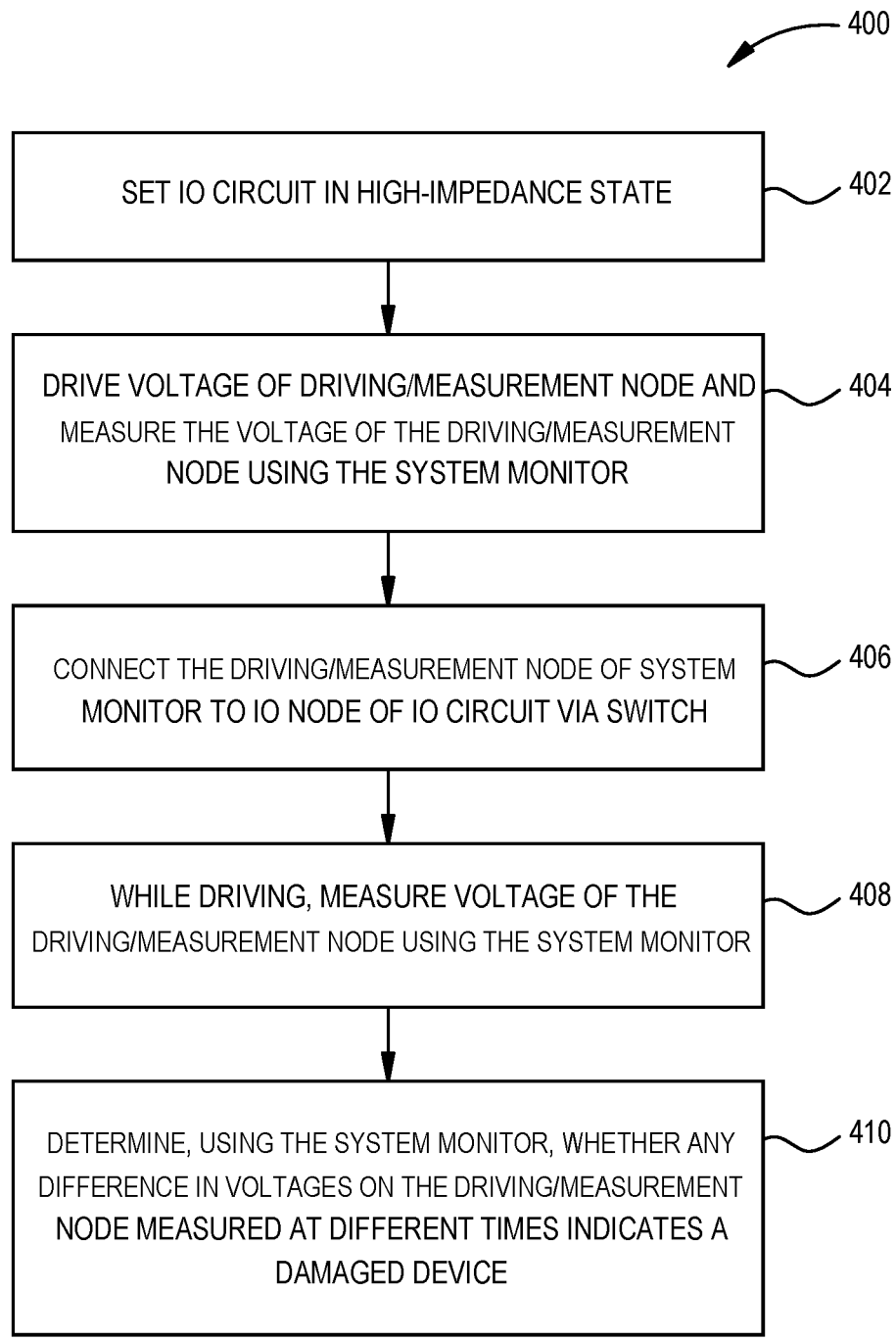
FIG. 5 is a flow chart of another method for performing a self-test, according to some examples.

FIG. 5 is a flow chart of a method 400 for performing a self-test, according to some examples. In operation 402, the IO circuit 204 is set to be in a high-impedance state, as in operation 302. In operation 404, before connecting the driving/measurement node 232 to the IO node 208, the system monitor 202 drives the driving/measurement node 232 to a voltage that is less than the voltage of the first power node 206 and greater than the voltage of the second power node 210. The driving in operation 404 can be performed as described above with respect to operation 306, although the driving/measurement node 232 is not connected to the IO node 208. Further, in operation 404, the system monitor 202 measures the voltage of the driving/measurement node 232 while driving the driving/measurement node 232, but before connecting the driving/measurement node 232 to the IO node 208. The measuring in operation 404 can also be performed as described above with respect to operation 306.

In operation 406, the driving/measurement node 232 of the system monitor 202 is connected to the IO node 208 via the switch 230, as in operation 304. In operation 408, while the system monitor drives the driving/measurement node 232 and while the driving/measurement node 232 is connected to the IO node 208, the system monitor 202 measures the voltage of the driving/measurement node 232 (used to charge the IO node 208), as described above with respect to operation 306. A voltage drop across or current through the output impedance 234 (e.g., resistance at DC) can be used to determine whether a device has been damaged. The impedance 234 has a magnitude that permits distinguishing a nominal leakage that may be within an acceptable specification of a device from a leakage that may be caused by damage to the device from an ESD event. In operation 410, the system monitor 202 determines whether any difference in voltages on the driving/measurement node 232 measured at different times indicates a damaged device, as described above with respect to operation 310.

As described previously, leakage through a device can occur as a result of the voltage drop between the IO node 208 and the first power node 206 or between the IO node 208 and the second power node 210. Hence, according to Kirchhoff's current law, the leakage current out of the IO circuit 204 and corresponding ESD protection circuit equals the current input to the IO circuit 204 and corresponding ESD protection circuit. Thus, with the system monitor 202, the current input to the IO circuit 204 and corresponding ESD protection circuit during testing equals the current through the output impedance 234. With a known output impedance 234, the current through the output impedance 234 can be determined by the voltage drop across the output impedance 234 (e.g., I=V/R).

When the switch 230 is open during the measurement in operation 404, substantially no current flows through the output impedance 234 such that the voltage at the terminal of the output impedance 234 distal from the driver 238 is equal to the voltage at a terminal of the output impedance 234 proximate the driver 238. Hence, in operation 404, the driving voltage provided by the driver 238 to the output impedance 234 is determined. When the switch 230 is closed for the measurement in operation 408, leakage current out of the IO circuit 204 and corresponding ESD protection circuit causes current to flow through the output impedance 234, which in turn causes a voltage drop from the driving voltage to the voltage on the driving/measurement node 232. Hence, a difference in voltages measured in operations 404 and 408 can determine a voltage drop across the output impedance 234. Further this voltage drop indicates the leakage current.

In some examples, the controller 240 of the system monitor 202 can determine if the voltage drop across the output impedance 234 is within or exceeds a specification. If the voltage drop is within the specification, no significant damage to a device in the IO circuit 204 or its corresponding ESD protection circuit is determined to have occurred, but if the voltage drop is not within the specification, damage to a device in the IO circuit 204 or its corresponding ESD protection circuit is determined to have occurred. For example, if the output impedance 234 is 35 kΩ, a voltage drop across the output impedance 234 of 3.5 mV or more indicates a leakage current of 100 nA or more, which may indicate damage of a device. If the output impedance 234 is 35 kΩ, a voltage drop across the output impedance 234 of less than 3.5 mV can indicate a leakage current of less than 100 nA, which may indicate no significant damage of a device. Different impedances can be implemented and can result in different voltage drops.

The controller 240 can write the determination to one or more registers of the registers 242 or other memory for subsequent access by a user and/or output to a user interface device. The method 400 can be performed on each IO circuit in the IC 200 and can be performed repeatedly for each IO circuit. The determinations resulting from the various performances of the method 400 can be written to the registers 242 or other memory and/or output to a user interface device. With the determination(s), a user can decide whether to provide the IC 200 to, e.g., a customer, to rework the package with the IC 200 (if possible), or to scrap the package.

As with the method 300, in the method 400 of FIG. 4, the voltage to which the driving/measurement node 232 can be driven can be the voltage of the first power node 206 (e.g., the power voltage VDD) and/or the voltage of the second power node 210 (e.g., ground GND). The method 400 can be performed twice, each at one of the different voltages, to determine whether a damaged device is present.

In some examples, the method 300 or 400 is performed while the IC 200 is at room temperature. Changes in temperature of the IC 200 can result in various parameters changing, such as conductivity of a device, etc. The specification can be based on parameters of the IC 200 at room temperature, and hence, for a valid comparison, measurements in some examples are obtained while the IC 200 is at room temperature. In other examples, the system monitor 202 may store Process-Voltage-Temperature (PVT) information of the IC 200 in the registers 242 or other memory. The controller 240 may be operable to access the PVT information from the registers 242 or memory and compensate any measurements or the specification when the IC 200 is not at room temperature. The system monitor 202 in such an example can further include a temperature sensor for determining the temperature of the IC 200.

Additionally, any IO node that is connected to another IC (e.g., through the second external connector 214) can affect a self-test of the respective IO circuit. The impedance and leakage of the other IC may be accounted for in the specification, and if a damaged device is determined to be present, such damaged device may be in either IC. If the IO node that is tested is not connected to another IC, any detected damage is present on the IC on which the self-test is performed.

While the foregoing is directed to specific examples, other and further examples may be devised without departing from the basic scope thereof, and the scope thereof is determined by the claims that follow.

What is claimed is:

1. An integrated circuit comprising:
an input/output circuit having an input/output node;
an Electro-Static Discharge (ESD) protection circuit connected to the input/output node; and
a system monitor having a driving/measurement node selectively connectable via a switch to the input/output node, the system monitor being configured to drive and measure a voltage of the driving/measurement node, the system monitor further being configured to determine, based on driving and measuring the voltage of the driving/measurement node, whether a damaged device is present, the damaged device being in the input/output circuit or the ESD protection circuit.

2. The integrated circuit of claim 1, wherein the system monitor comprises a driver and an analog-to-digital converter (ADC), the driver being connected to the driving/measurement node and operable to drive the voltage, the ADC being connected to the driving/measurement node and operable to measure the voltage.

3. The integrated circuit of claim 1 wherein the switch is connected between the input/output node and the driving/measurement node, the system monitor being operable to control the switch to be in an open state or a closed state, the switch being operable to selectively connect the driving/measurement node to the input/output node.

4. The integrated circuit of claim 1, wherein the system monitor is operable to:
when the driving/measurement node is connected to the input/output node:
drive the input/output node to a drive voltage;
terminate driving the input/output node; and
after a pre-determined amount of time has elapsed from terminating driving the input/output node, measure a measured voltage of the input/output node; and
determine whether a difference between an earlier voltage of the input/output node and the measured voltage indicates whether the damaged device is present.

5. The integrated circuit of claim 4, wherein the earlier voltage is the drive voltage, the system monitor being operable to measure the drive voltage of the input/output node while driving the input/output node.

6. The integrated circuit of claim 4, wherein:
the damaged device is indicated as present when a magnitude of the difference exceeds a specification; and
the damaged device is indicated as not being present when the magnitude of the difference does not exceed the specification.

7. The integrated circuit of claim 1, wherein the system monitor is operable to:
while driving the voltage of the driving/measurement node:
measure a first measured voltage of the driving/measurement node when the driving/measurement node is not connected to the input/output node;
connect the driving/measurement node to the input/output node; and
measure a second measured voltage of the driving/measurement node when the driving/measurement node is connected to the input/output node; and
determine whether a difference between the first measured voltage and the second measured voltage indicates whether the damaged device is present.

8. A method of operating an integrated circuit, the method comprising:
selectively connecting, using a switch, a driving/measurement node of a system monitor to an input/output node of an input/output circuit, an Electro-Static Discharge (ESD) protection circuit being connected to the input/output node;

driving, using the system monitor, a voltage of the driving/measurement node, at least some of the driving being performed while the driving/measurement node is connected to the input/output node;

determining, using the system monitor, a voltage difference between measured voltages of the driving/measurement node, the voltage difference being at least partially in response to driving the voltage of the driving/measurement node;

determining, using the system monitor, whether the voltage difference indicates a presence of a damaged device, wherein the damaged device is in the input/output circuit or the ESD protection circuit; and storing in memory, using the system monitor, a result corresponding to whether the voltage difference indicates the presence of the damaged device.

9. The method of claim 8 further comprising outputting the result to a user device.

10. The method of claim 8 further comprising setting the input/output circuit to a high-impedance state.

11. The method of claim 8, wherein the switch is controlled by the system monitor.

12. The method of claim 8, wherein the system monitor comprises:
 a driver, wherein the driver is used to charge the driving/measurement node; and
 an analog-to-digital converter (ADC), wherein the ADC is used to measure the measured voltages of the driving/measurement node.

13. The method of claim 8, wherein:
determining the voltage difference between the measured voltages of the driving/measurement node includes:
 driving the voltage of the driving/measurement node when the driving/measurement node is connected to the input/output node;
 terminating driving the voltage of the driving/measurement node; and
 after a pre-determined amount of time has elapsed from terminating driving the voltage of the driving/measurement node, measuring a subsequent measured voltage of the driving/measurement node when the driving/measurement node is connected to the input/output node, wherein the voltage difference is between an earlier measured voltage of the driving/measurement node and the subsequent measured voltage; and
determining whether the voltage difference indicates the presence of the damaged device includes comparing the voltage difference to a specification, wherein the presence of the damaged device is indicated when a magnitude of the voltage difference exceeds the specification.

14. The method of claim 13, wherein determining the voltage difference between the measured voltages of the driving/measurement node includes:
 measuring the earlier measured voltage of the driving/measurement node when driving the voltage of the driving/measurement node and the driving/measurement node is connected to the input/output node.

15. The method of claim 8, wherein:
determining the voltage difference between the measured voltages of the driving/measurement node includes:
 driving the voltage of the driving/measurement node when the driving/measurement node is not connected to the input/output node;
 measuring a first measured voltage of the driving/measurement node when the driving/measurement node is not connected to the input/output node and while driving the voltage of the driving/measurement node; and
 measuring a second measured voltage of the driving/measurement node when the driving/measurement node is connected to the input/output node and while driving the voltage of the driving/measurement node, wherein the voltage difference is between the first measured voltage and the second measured voltage; and
determining whether the voltage difference indicates the presence of the damaged device includes comparing the voltage difference to a specification, wherein the presence of the damaged device is indicated when a magnitude of the voltage difference exceeds the specification.

16. An integrated circuit comprising:
an input/output circuit having an input/output node;
an Electro-Static Discharge (ESD) protection circuit connected to the input/output node; and
a system monitor having a driving/measurement node selectively connectable via a switch to the input/output node, the system monitor comprising:
 a driver configured to drive a voltage of the driving/measurement node;
 an analog-to-digital converter (ADC) configured to obtain measurement data relating to the driving/measurement node; and
 a controller communicatively coupled to the driver and the ADC, the controller being operable to determine whether the measurement data, in response to driving the voltage of the driving/measurement node, indicates a presence of a damaged device, wherein the damaged device is in the input/output circuit or the ESD protection circuit.

17. The integrated circuit of claim 16 wherein the switch is connected between the input/output node and the driving/measurement node, the controller being operable to control the switch to be in a closed state or in an open state.

18. The integrated circuit of claim 16, wherein the ADC and the controller are configured to:
 after a pre-determined amount of time has elapsed from terminating driving the voltage of the driving/measurement node by the driver, obtain a measured voltage of the driving/measurement node when the driving/measurement node is connected to the input/output node; and
 determine a voltage difference between an earlier voltage of the driving/measurement node and the measured voltage, wherein the controller is operable to determine whether the voltage difference indicates the presence of the damaged device.

19. The integrated circuit of claim 18, wherein the ADC and the controller are configured to obtain the earlier voltage during driving the voltage of the driving/measurement node by the driver when the driving/measurement node is connected to the input/output node.

20. The integrated circuit of claim 16, wherein:
the system monitor further includes an impedance disposed between an output of the driver and the driving/measurement node; and the ADC and the controller are configured to, when the driver drives the voltage of the driving/measurement node:
  measure a first measured voltage at the driving/measurement node when the driving/measurement node is not connected the input/output node; and
  measure a second measured voltage at the driving/measurement node when the driving/measurement node is connected the input/output node, wherein the controller is operable to determine whether a difference between the first measured voltage and the second measured voltage indicates the presence of the damaged device.

* * * * *